United States Patent [19]
Fasano et al.

[11] Patent Number: 6,136,419
[45] Date of Patent: Oct. 24, 2000

[54] CERAMIC SUBSTRATE HAVING A SEALED LAYER

[75] Inventors: Benjamin V. Fasano, New Windsor; Richard F. Indyk, Wappingers Falls, both of N.Y.; Sundar M. Kamath, San Jose, Calif.; John U. Knickerbocker, Hopewell Junction, N.Y.; Scott I. Langenthal, Hyde Park, N.Y.; Daniel P. O'Connor, Poughkeepsie, N.Y.; Srinivasa S. N. Reddy, LaGrangeville, N.Y.

[73] Assignee: International Business Machines Corporation, Armonk, N.Y.

[21] Appl. No.: 09/320,532

[22] Filed: May 26, 1999

[51] Int. Cl.$^7$ .................................................. B32B 3/00
[52] U.S. Cl. ..................... 428/210; 174/250; 174/257; 174/262; 174/263
[58] Field of Search ...................... 174/250, 251, 174/257, 262, 263; 428/209, 210

[56] References Cited

U.S. PATENT DOCUMENTS

| | | | |
|---|---|---|---|
| 4,301,324 | 11/1981 | Kumar et al. | 174/68.5 |
| 4,594,181 | 6/1986 | Siuta | 252/512 |
| 4,880,684 | 11/1989 | Boss et al. | 428/209 |
| 5,029,242 | 7/1991 | Sammet | 174/257 |
| 5,073,180 | 12/1991 | Farooq et al. | 65/18.4 |
| 5,260,519 | 11/1993 | Knickerbocker et al. | 174/262 |
| 5,293,504 | 3/1994 | Knickerbocker et al. | 174/262 |
| 5,763,093 | 6/1998 | Casey et al. | 428/469 |

*Primary Examiner*—Cathy F. Lam
*Attorney, Agent, or Firm*—Ira D. Blecker

[57] ABSTRACT

Disclosed is a multilayer ceramic substrate, and a method for forming same, which has an outer unsealed layer having a metallic via, an inner sealed layer having a composite via of metallic and ceramic materials and a further unsealed layer having a metallic via.

29 Claims, 3 Drawing Sheets

CERAMIC SUBSTRATE HAVING A SEALED LAYER

BACKGROUND OF THE INVENTION

This invention relates to multilayer ceramic substrates, and more particularly relates to multilayer ceramic substrates having a sealed layer which are useful for electronics packaging and to a method for making such substrates.

Glass, ceramic and glass ceramic (hereinafter just ceramic) structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators The substrates may be designed with termination pads for attaching semiconductor chips, connector leads, capacitors, resistors, covers, etc. Interconnection between buried conductor levels can be achieved through vias formed by metal paste-filled holes in the individual ceramic layers formed prior to lamination, which, upon sintering will become a sintered dense metal interconnection of metal based conductor.

In general, conventional ceramic structures are formed from ceramic green sheets which are prepared by mixing a ceramic particulate, a binder, plasticizers and solvents. This composition is spread or cast into ceramic sheets or slips from which the solvents are subsequently volatilized to provide coherent and self-supporting flexible green sheets. After blanking, via formation, stacking and laminating, the green sheet laminates are eventually fired at temperatures sufficient to drive off the binder resin and sinter the ceramic particulates together into a densified ceramic substrate.

Present state-of-the-art ceramic substrates are made from cordierite glass-ceramic particulate materials such as that disclosed in Kumar et al. U.S. Pat. No. 4,301,324, the disclosure of which is incorporated by reference herein. These substrates exhibit a dielectric constant of about 5 and a coefficient of thermal expansion (CTE) that closely matches that of silicon. It is desirable to fabricate substrates out of low dielectric constant materials so as to increase signal propagation speed, which varies inversely with the square root of the dielectric constant. The electrical conductors suitable for use with such glass-ceramic materials include copper and its alloys, silver and its alloys, and gold and its alloys.

It has been found by others that the vias do not completely seal to the ceramic material, thereby possibly resulting in a gap between the metallic via and the ceramic bulk material. This gap is undesirable as it reduces the hermeticity of the fabricated substrate as well as allowing fluids to seep into the substrate during processing. Accordingly, it has been proposed in Farooq et al., U.S. Pat. No. 5,073,180, the disclosure of which is incorporated by reference herein, to seal at least the top layer of a multilayer ceramic substrate with a composite via material consisting of metallic and ceramic (including glass) materials. The internal vias are essentially all metal. As taught by Siuta U.S. Pat. No. 4,594,181, the disclosure of which is incorporated by reference herein, the internal vias may also include small amounts of alumina or other ingredients to inhibit the densification of the metallic via.

At the interface between the composite sealing via and the metallic internal via, and/or at the interface between the internal via and the bulk ceramic, there is a mismatch of coefficients of thermal expansion and some difference in densification behavior during cofiring which makes the interface susceptible to fatigue failure when the substrate is exposed to thermal stress. The result is that an unrepairable open may occur at one of the above interfaces. If the net containing the open cannot be rerouted, the entire substrate must be scrapped. To alleviate the mismatch in coefficients of thermal expansion between the various vias, Knickerbocker et al. U.S. Pat. No. 5,293,504, the disclosure of which is incorporated by reference herein, have proposed capping the vias with a composite material comprising metallic and ceramic materials.

As an alternative to sealing the vias, a thin film sealing layer can be deposited on the surface of the ceramic substrate such as that disclosed in Boss et al. U.S. Pat. No. 4,880,684, the disclosure of which is incorporated by reference herein.

It is desirable to have a low TCE ceramic substrate that is of lower cost and easier manufacture.

Thin films beside being complicated to manufacture also dramatically increase the cost of manufacture of the ceramic substrate.

The various methods disclosed above that propose sealing the vias have worked well in practice. However, the present inventors have determined that due to the composite nature of the sealed via, there is a weaker bond to a joined chip than if the via was 100% metal. Too, the fact that the composite via contains a non-wettable ceramic material, plated metal and solder only adheres to the metallic portion of the via, thereby reducing the wettable area of the via.

It would be desirable to have a ceramic substrate having vias that are sealed and yet are easily joined to a chip or other device.

Accordingly, it is a purpose of the present invention to have a ceramic substrate with a sealed via layer to provide necessary hermeticity to the ceramic substrate.

It is another purpose of the present invention to have a via for joining to a chip or other device that is both wettable by plating and solder and that provides good chip pull strength.

These and other purposes of the present invention will become more apparent after referring to the following description of the invention considered in conjunction with the accompanying drawings.

BRIEF SUMMARY OF THE INVENTION

A first aspect of the invention relates to a multilayer ceramic substrate having a sealed layer comprising:

plurality of layers of ceramic material;

a first layer of the plurality of layers of ceramic material having at least one via filled with a metallic material and substantially no ceramic material;

a second layer of the plurality of layers of ceramic material adjacent to the first layer and having at least one via filled with a material comprising metallic material and ceramic material; and a third layer of the plurality of layers of ceramic material adjacent to the second layer and having at least one via filled with a metallic material and substantially no ceramic material.

A second aspect of the invention relates to a multilayer ceramic substrate having a sealed layer comprising:

a plurality of layers of ceramic material;

a first layer of the plurality of layers of ceramic material having at least one via filled with a metallic material and substantially no ceramic material;

a first via cap interposed between the at least one via in the first layer and the at least one via in the second layer, the first via cap comprising metallic material and ceramic material;

a second layer of the plurality of layers of ceramic material adjacent to the first layer and having at least one via filled with a material comprising metallic material and ceramic material;

a second via cap interposed between the at least one via in the second layer and the at least one via in the third layer, the second via cap comprising metallic material and ceramic material; and a third layer of the plurality of layers of ceramic material adjacent to the second layer and having at least one via filled with a metallic material and substantially no ceramic material.

A third aspect of the invention relates to a method of forming a multilayer ceramic substrate having a sealed layer comprising the steps of:

forming a first unsintered layer of ceramic material having at least one via filled with a metallic material and substantially no ceramic material;

forming a second unsintered layer of ceramic material having at least one via filled with a material comprising metallic material and ceramic material;

forming a third unsintered layer of ceramic material having at least one via filled with a metallic material and substantially no ceramic material;

stacking and laminating the first, second and third unsintered layers of ceramic material such that the first layer is adjacent to the second layer, the second layer is adjacent to the third layer and the at least one via in each of the layers are in alignment with each other; and sintering the stack of first, second and third layers of ceramic material to form a multilayer ceramic substrate having a sealed layer.

A fourth aspect of the present invention relates to a method of forming a multilayer ceramic substrate having a sealed layer comprising the steps of:

forming a first unsintered layer of ceramic material having at least one via filled with a metallic material and substantially no ceramic material;

forming a second unsintered layer of ceramic material having at least one via filled with a material comprising metallic material and ceramic material;

forming a first via cap on the at least one via in the first or second unsintered layer of ceramic material;

forming a third unsintered layer of ceramic material having at least one via filled with a metallic material and substantially no ceramic material;

forming a second via cap on the at least one via in the second or third unsintered layer of ceramic material;

stacking and laminating the first, second and third unsintered layers of ceramic material such that the first layer is adjacent to the second layer with the first via cap interposed between the first and second layers, the second layer is adjacent to the third layer with the second via cap interposed between the second and third layers and the at least one via in each of the layers and the first and second via caps are in alignment with each other; and sintering the stack of first, second and third layers of ceramic material to form a multilayer ceramic substrate having a sealed layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
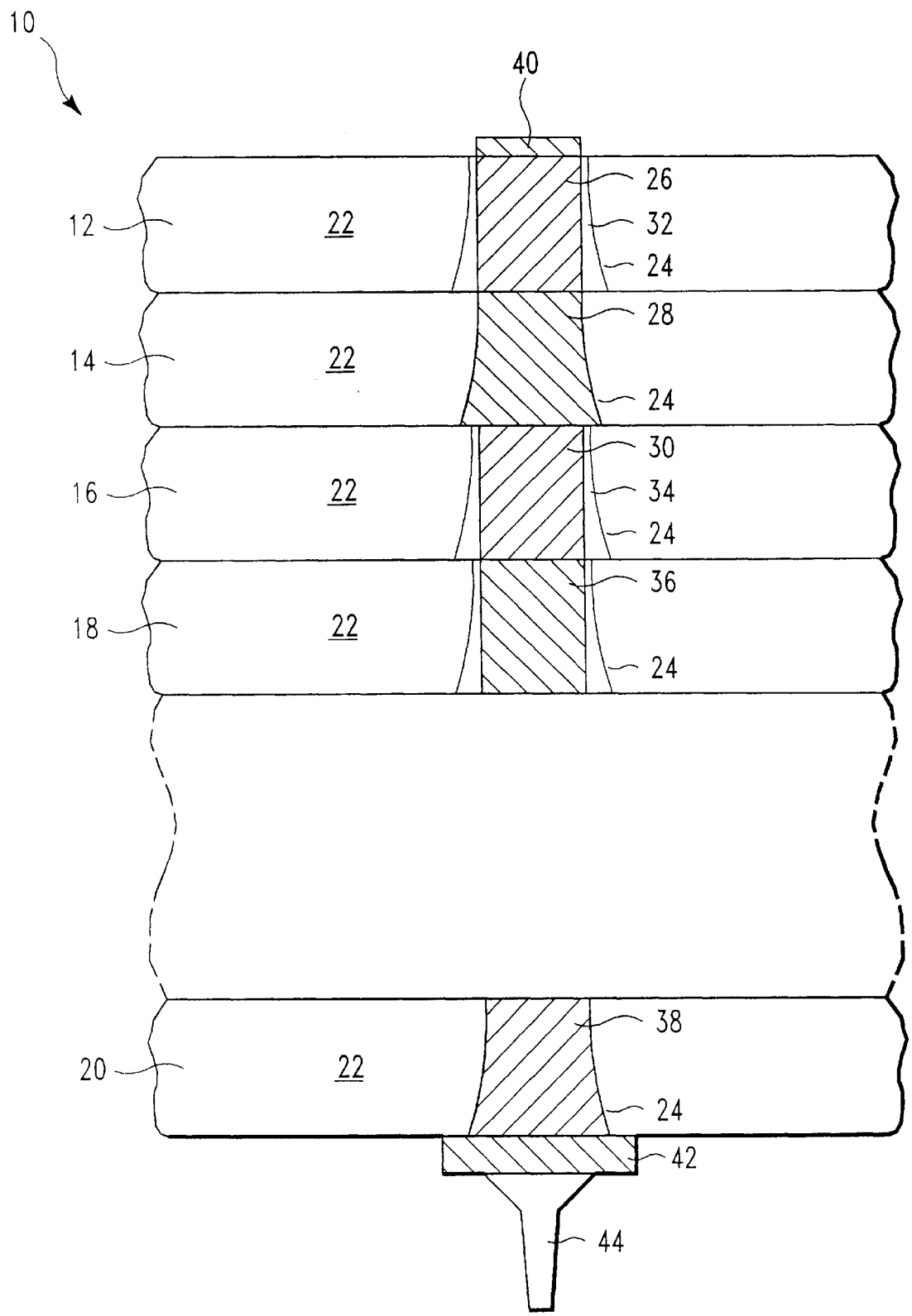
FIG. 1 is a partial cross sectional view of a first embodiment of the ceramic substrate according to the present invention.

Referring to the Figures in more detail, and particularly referring to FIG. 1, there is shown a ceramic substrate 10 which consists at least of layers 12, 14, and 16 but may, and usually does, also consists of additional layers 18 and 20.

Each of the layers principally comprises a ceramic material portion 22 and at least one via portion 24. Not germane to the present invention, and therefore not shown, are the various wiring lines that would ordinarily be present on each of the layers. As is well known in the art, the vias in predetermined layers are aligned with one another so that electrical signals and power can be transmitted between the layers. For example, as shown in FIG. 1, all the via portions 24 are in alignment so that an electrical signal may be transmitted through all of layers 12–20.

Layers 12, 14, 16 have been designed so as to hermetically seal the ceramic substrate 10 while also providing vias that have maximum conductivity. Discussing the invention in more detail, via portion 24 of layer 12 contains a via 26 that is filled only with metallic material and substantially no ceramic material. Layer 12 forms the outermost layer of the ceramic substrate 12. It should be understood, however, that such vias may include small amounts of ceramic material, such as alumina, to control densification of the via material. Where such ceramic material is present in the metallic via, it will usually be present in a small amount less than about 10 volume percent. Due to the fact that via 26 is a metallic via (substantially no ceramic material), there will be no sealing between the via 26 and the ceramic portion 22, thereby resulting in gap 32 between the via 26 and the ceramic portion 22. Gap 32 is on the order of 1–2 microns. Normally such a gap 32 would be problem since liquids and gases which are present during and after sintering would cause internal damage to the ceramic substrate 10.

According to the present invention, however, the present inventors have inserted via 28 in layer 14. In this case, via 28 is a so-called composite via in that it contains a mixture of metallic material and ceramic material. The composite via 28 seals the ceramic substrate so that any fluids or gases that are present can proceed no deeper than the first layer 12 of ceramic substrate 10.

The third layer contemplated by the present invention is layer 16 having via 30. Again, via 30 is a metallic via having substantially no ceramic material as was discussed with respect to via 26 in layer 12. Since via 30 is a metallic via, there will be a gap 34 formed between the via 30 and ceramic portion 22. But, since via 30 is internal to the ceramic substrate 10 and thus protected by sealed via 28 in layer 14, the fact that via 30 is not sealed is unimportant.

In use, there may be one or more additional internal layers 18 having metallic vias 36.

Ceramic substrate 10 will typically have layer 20 which seals the other outer portion of the ceramic substrate 10. Via 38 in layer 20 is sealed by conventional means. Optionally, present invention will have wide applicability to a number of materials systems. However, the present invention is particularly suitable for low temperature sintering systems where sealing of the ceramic substrate is a particular problem. Among these low temperature sintering systems are the glass-ceramic and glass plus ceramic systems. Examples of suitable ceramic compositions are those disclosed in the accompanying Table I.

TABLE 1

GLASS CERAMIC COMPOSITIONS (WEIGHT PERCENT)

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $SiO_2$ | 55.0 | 54.5 | 54.5 | 52.3 | 57.8 | 60.0 | 50.0 | 53.9 | 54.0 | 55.0 | 60.0 | 54.5 | 57.0 | 55.0 | 47.0 | 53.9 | 54.0 | 54.5 | 54.0 | 54.0 |
| $Al_2O_3$ | 21.1 | 21.0 | 21.0 | 19.7 | 22.2 | 18.2 | 22.9 | 20.7 | 21.0 | 21.0 | 17.0 | 20.0 | 21.0 | 21.0 | 33.5 | 20.8 | 22.0 | 21.3 | 22.0 | 21.0 |
| MgO | 22.3 | 19.8 | 19.8 | 24.0 | 16.0 | 17.8 | 22.2 | 19.6 | 19.0 | 18.0 | 18.0 | 20.0 | 20.0 | 22.0 | 13.5 | 19.6 | 20.0 | 19.9 | 20.0 | 22.0 |
| $B_2O_3$ | 1.3 | 1.0 | 1.0 | 1.0 | 1.0 | 1.0 | 1.1 | 1.0 | 1.0 | 1.0 | 1.0 | 1.0 | 1.0 | 2.0 | 3.0 | 1.0 | 1.0 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 | 3.0 | 1.5 | 1.0 | | 3.0 | 2.7 | 2.0 | 2.8 | 2.0 | |
| $C3O_2$ | | 1.0 | | | | | | | | | | | | | | | | | | |
| MnO | | | 1.0 | | | | | | | | | | | | | | | | | |
| $ZrO_2$ | | | | | | | | | 2.0 | | | | 2.0 | | | | | | | |
| CaO | | | | | | | | 2.0 | | | | 1.0 | | | | | | | | |
| NiO | | | | | | | | | | 2.0 | | | | | | | | | | |
| $Li_2O$ | | | | | | | | | | | 1.0 | | | | | | | | | |
| $Fe_2O_3$ | | | | | | | | | | | | | | | | 2.0 | | | | |
| $Na_2O$ | | | | | | | | | | | | | | | | | 1.0 | | | |
| $TiO_2$ | | | | | | | | | | | | | | | | | | 1.0 | | |
| ZnO | | | | | | | | | | | | | | | | | | | 1.0 | |
| CuO | | | | | | | | | | | | | | | | | | | | 2.0 | the bottom of ceramic substrate 10, can be sealed in the same manner as top layers 12, 14.

In the manner just described, a ceramic substrate 10 is formed which is sealed except for the first layer 12. Layer 12 is preferred for use as the so-called top surface metallurgy layer which receives a chip or other device (not. shown). To facilitate bonding with the chip or other device, via 26 is coated or plated with a metallic material 40, usually nickel or gold. Since via 26 is a metallic via with substantially no ceramic material, metallic material 40 readily adheres to via 26 and provides an excellent surface for bonding a chip or other device by solder or conductive adhesive. Layer 20 is preferred for use as the so-called bottom surface metallurgy layer and includes pad 42 for attachment of an input/output (I/O) pin 44 or solder balls or columns (not shown). Pad 42, will also serve as the terminal contact metallurgy for land grid array (LGA) applications.

Figure 2:
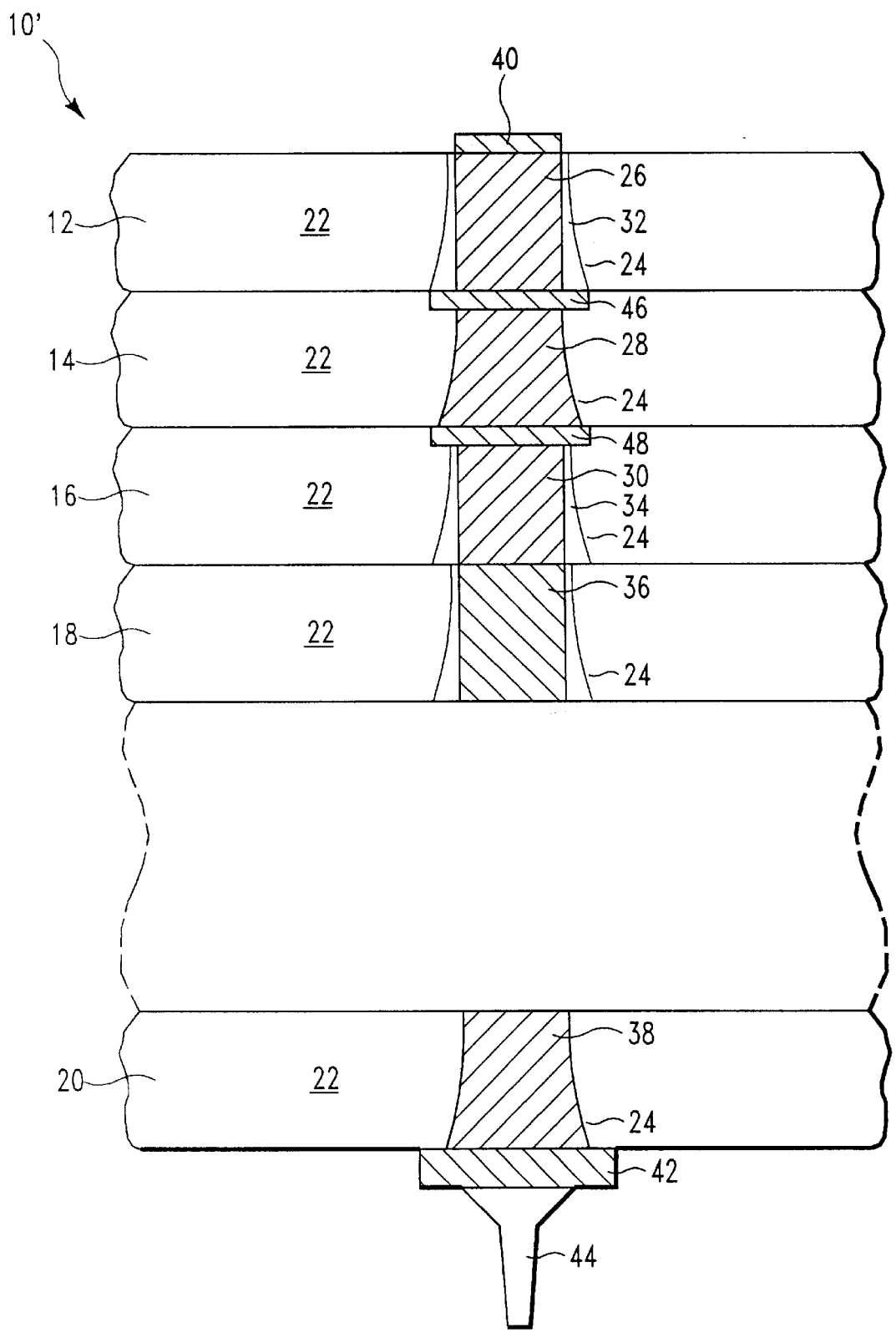
FIG. 2 is a partial cross sectional view of a second embodiment of the ceramic substrate according to the present invention.

Referring now to FIG. 2, there is shown a second embodiment of the present invention. Ceramic substrate 10' is similar to ceramic substrate 10 as discussed previously with respect to FIG. 1. Ceramic substrate 10', however, additionally includes at least first via cap 46. First via cap 46 is a composite material comprising metallic material and ceramic material. The first via cap improves electrical reliability of the interface between the 100% metal level one via and the composite level two via and, additionally improves mechanical strength of the vias. More preferably, ceramic substrate 10' further comprises second via cap 48 which also is a composite material comprising metallic material and ceramic material. The second via cap, similarly to the first via cap, is for electrical and mechanical reliability.

The materials that comprise the ceramic portions, the vias and the via caps may be selected from a wide variety of ceramic and metallic materials as it is contemplated that the The metallic materials used for wiring are typically copper, silver, gold and their respective alloys. The present inventors prefer copper for the metallic material and with regard to the via 26 in the first layer 12 most particularly prefer an alloy of copper and nickel, preferably 90 volume percent copper and 10 percent nickel. Such a copper/nickel alloy is preferred for its greater corrosion resistance during storage, plating and service operations.

For the composite vias and the via caps, it is preferred that they comprise 60 to 40 volume percent metallic material (preferably copper) and 40 to 60 volume percent ceramic material. Most preferably, the composite via should comprise 40 volume percent copper and 60 volume percent ceramic material and the via cap should comprise 45 volume percent copper and 55 volume percent ceramic material.

It should be understood that while each of the various layers in the Figures show only one via per layer, it should be understood that there will typically be many vias such vias per layer. As is well known in the art, the number of vias in each layer may be in the tens for lower functioning ceramic substrates and in the hundreds or thousands for higher functioning ceramic substrates.

Figure 3:
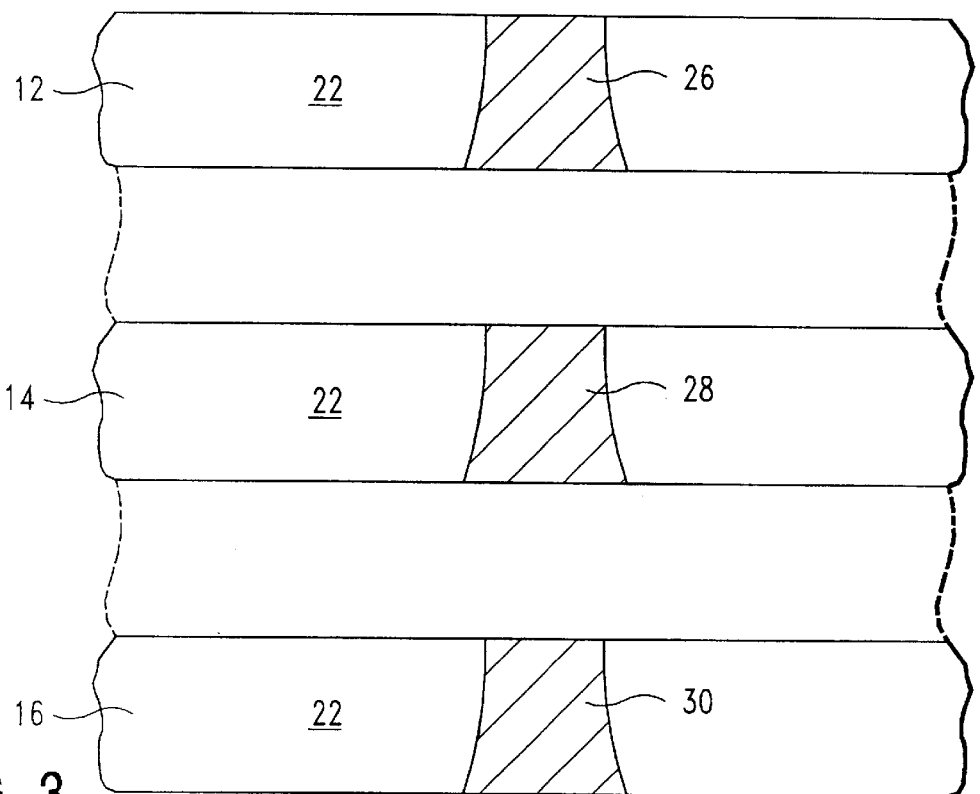
FIG. 3 illustrates the process for forming the first embodiment of the present invention.

Referring now to FIG. 3, there is shown the method of forming ceramic substrate 10. Each of layers 12, 14, 16 are formed separately as is conventional in the art. Vias 26, 28, 30 are filled with a paste composition that is appropriate for the layer. That is, layers 12, 16 each have at least one via filled with a paste that comprises metallic material and substantially no ceramic material while layer 14 has at least one via filled with a composite paste comprising metallic material and ceramic material. Other required layers would be formed in a similar manner. Then, all layers are stacked, laminated and sintered as is conventional in the art to result in the ceramic substrate 10 shown in FIG. 1.

Figure 4:
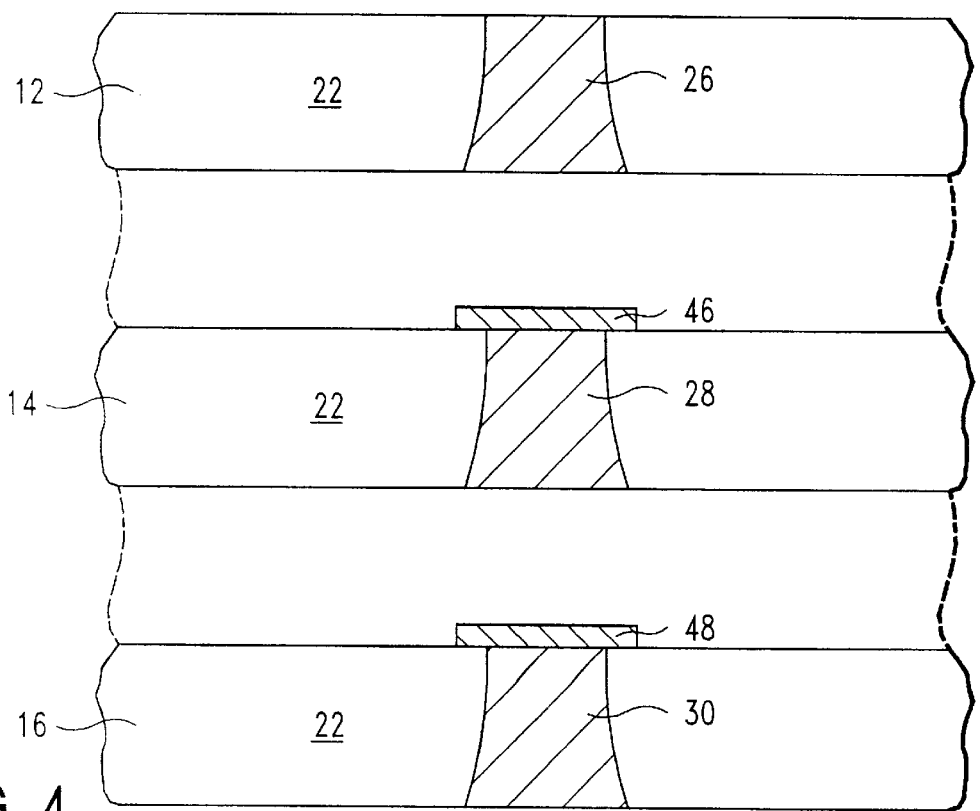
FIG. 4 illustrates the process for forming the second embodiment of the present invention.

Referring now to FIG. 4, there is shown the method of forming ceramic substrate 10'. The method of forming ceramic substrate 10' is similar to the forming of ceramic substrate 10. The difference between the formation of ceramic substrates 10, 10' lies in the addition of first via cap 46 and, preferably also, second via cap 48. It is required that ceramic substrate 10' have at least first via cap 46 which can be formed (screened) on either layer 12 or, as shown in FIG. 4, layer 14. As long as via cap 46 can be interposed between via 26 of layer 12 and via 28 of layer 14, it doesn't matter which layer the via cap 46 is formed on. Preferably, second via cap 48 is added to ceramic substrate 10'. Again, it doesn't matter whether second via cap 48 is formed (screened) on layer 14 or layer 16 so long as via cap 48 can be interposed between via 28 of layer 14 and via 30 of layer 16. Other layers that are required for the formation of the ceramic substrate 10' would be formed in a conventional manner then all of the various layers are stacked, laminated and sintered to form ceramic substrate 10'.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate having a sealed layer comprising:
   a plurality of layers of ceramic material;
   a first layer of the plurality of layers of ceramic material having at least one via filled with a metallic material and substantially no ceramic material;
   a second layer of the plurality of layers of ceramic material adjacent to the first layer and having at least one via filled with a material comprising metallic material and ceramic material; and
   a third layer of the plurality of layers of ceramic material adjacent to the second layer and having at least one via filled with a metallic material and substantially no ceramic material.

2. The ceramic substrate of claim 1 further comprising a first via cap interposed between the at least one via in the first layer and the at least one via in the second layer.

3. The ceramic substrate of claim 2 wherein the first via cap comprises metallic material and ceramic material.

4. The ceramic substrate of claim 3 wherein the first via cap comprises 60–40 volume percent metallic material and 40–60 volume percent ceramic material.

5. The ceramic substrate of claim 3 wherein the metallic material is copper and the ceramic material is a glass ceramic material.

6. The ceramic substrate of claim 1 further comprising a second via cap interposed between the at least one via in the second layer and the at least one via in the third layer.

7. The ceramic substrate of claim 6 wherein the second via cap comprises metallic material and ceramic material.

8. The ceramic substrate of claim 7 wherein the second via cap comprises 60–40 volume percent metallic material and 40–60 volume percent ceramic material.

9. The ceramic substrate of claim 8 wherein the metallic material is copper and the ceramic material is a glass ceramic material.

10. The ceramic substrate of claim 1 wherein the at least one via in the first layer has a first surface adjacent the second layer and a second surface opposite the first surface and further comprising a plated metallic material on the second surface.

11. The ceramic substrate of claim 10 wherein the plated metallic material on the second surface is selected from the group consisting of nickel and gold.

12. The ceramic substrate of claim 11 further comprising a quantity of solder material on the plated second surface.

13. The ceramic substrate of claim 1 wherein the at least one via in the second layer comprises 60–40 volume percent metallic material and 40–60 volume percent ceramic material.

14. The ceramic substrate of claim 13 wherein the metallic material comprises copper and the ceramic material comprises a glass ceramic material.

15. The ceramic substrate of claim 1 wherein the metallic material in the at least one via in the first layer is copper or an alloy of copper and nickel.

16. The ceramic substrate of claim 15 wherein the alloy of copper and nickel is 90 volume percent copper and 10 volume percent nickel.

17. The ceramic substrate of claim 1 wherein the metallic material in the at least one via in the third layer is copper.

18. The ceramic substrate of claim 1 further comprising a fourth layer of the plurality of layers of ceramic material adjacent to the third layer and having at least one via filled with a metallic material and substantially no ceramic material.

19. The ceramic substrate of claim 18 wherein the metallic material of the at least one via of the fourth layer is copper.

20. The ceramic substrate of claim 1 wherein the first layer is an outermost layer of the ceramic substrate.

21. The ceramic substrate of claim 1 wherein the first layer comprises a top surface metallurgy layer.

22. A multilayer ceramic substrate having a sealed layer comprising:
   a plurality of layers of ceramic material;
   a first layer of the plurality of layers of ceramic material having at least one via filled with a metallic material and substantially no ceramic material;
   a second layer of the plurality of layers of ceramic material adjacent to the first layer and having at least one via filled with a material comprising metallic material and ceramic material;
   a first via cap interposed between the at least one via in the first layer and the at least one via in the second layer, the first via cap comprising metallic material and ceramic material;
   a third layer of the plurality of layers of ceramic material adjacent to the second layer and having at least one via filled with a metallic material and substantially no ceramic material; and
   a second via cap interposed between the at least one via in the second layer and the at least one via in the third layer, the second via cap comprising metallic material and ceramic material.

23. The ceramic substrate of claim 22 wherein the at least one via in the second layer, the first via cap and the second via cap comprise 60–40 volume percent metallic material and 40–60 volume percent ceramic material.

24. The ceramic substrate of claim 23 wherein the metallic material is copper and the ceramic material is a glass ceramic material.

25. The ceramic substrate of claim 22 wherein the metallic material of the at least one via of the first layer is copper or an alloy of copper and nickel.

26. The ceramic substrate of claim 25 wherein the alloy of copper and nickel is 90 volume percent copper and 10 volume percent nickel.

27. The ceramic substrate of claim 22 wherein the metallic material in the at least one via in the third layer is copper.

28. The ceramic substrate of claim 22 wherein the first layer is an outermost layer of the ceramic substrate.

29. The ceramic substrate of claim 22 wherein the first layer comprises a top surface metallurgy layer.

* * * * *